(12) United States Patent
Van Delden

(10) Patent No.: US 7,586,387 B2
(45) Date of Patent: Sep. 8, 2009

(54) ELECTRONIC DEVICE AND METHOD OF MATCHING THE IMPEDANCE THEREOF

(75) Inventor: Martinus Hermanus Wilhelmus Maria Van Delden, Eindhoven (NL)

(73) Assignee: NXP B.V., Eindhoven (NL)

( * ) Notice: Subject to any disclaimer, the term of this patent is extended or adjusted under 35 U.S.C. 154(b) by 314 days.

(21) Appl. No.: 10/516,147

(22) PCT Filed: Jun. 5, 2003

(86) PCT No.: PCT/IB03/02412

§ 371 (c)(1),
(2), (4) Date: Nov. 30, 2004

(87) PCT Pub. No.: WO03/105174

PCT Pub. Date: Dec. 18, 2003

(65) Prior Publication Data

US 2005/0237127 A1 Oct. 27, 2005

(30) Foreign Application Priority Data

Jun. 5, 2002 (EP) .................................. 02077202

(51) Int. Cl.
*H01P 1/10* (2006.01)
*H01P 5/12* (2006.01)
(52) U.S. Cl. ...................................... 333/101; 333/105
(58) Field of Classification Search ................. 333/164, 333/105, 159, 161, 262
See application file for complete search history.

(56) References Cited

U.S. PATENT DOCUMENTS

| 5,578,976 | A | 11/1996 | Yao |
| 6,232,841 | B1 * | 5/2001 | Bartlett et al. ............... 330/305 |
| 6,232,847 | B1 * | 5/2001 | Marcy et al. ................. 331/167 |
| 6,281,838 | B1 * | 8/2001 | Hong .......................... 342/371 |

\* cited by examiner

*Primary Examiner*—Dean O Takaoka

(57) ABSTRACT

An adjustable impedance matching network comprising passive elements (2, 4, 10, 12) and at least a pair of micro-electromechanical switch-assemblies (6, 8, 14, 16), said switch-assemblies (6, 8, 14, 16) being connected to the passive elements (2, 4, 10, 12) to form parallel circuits and/or serial circuits of said passive elements (2, 4, 10, 12) and said switch-assemblies (6, 8, 14, 16), said circuits having a range of impedance values.

11 Claims, 13 Drawing Sheets

ELECTRONIC DEVICE AND METHOD OF MATCHING THE IMPEDANCE THEREOF

The invention relates to an electronic device provided with a micro-electromechanical-system switch on a substrate.

The invention also relates to a mobile telecommunication apparatus comprising such an electronic device.

The invention further relates to a method of matching the impedance of an electronic device.

Such an electronic device is known from U.S. Pat. No. 5,578,976. In the known device the micro-electromechanical-system switch—hereinafter also called MEMS-switch—is provided with a fixed electrode and a movable electrode, and a control structure. The movable electrode is movable between a first position in which it is separated from the fixed electrode through an airgap, and a second position in which it is in physical contact with the fixed electrode. The control structure comprises a first electrode and a second electrode, which second electrode is mechanically connected with but electrically isolated from the movable electrode, such that a displacement of the second electrode moves the movable electrode towards or away from the fixed electrode, which second electrode is displaceable by application of a voltage difference between the first and second electrode. The movable electrode and the second electrode of the control structure are mechanically connected through an electrically insulating cantilever arm. The second electrode of the control structure is formed by an electrically conductive layer that is present on the cantilever arm and that extends to a support structure at an end of the cantilever arm. The movable electrode of the switch is present under the cantilever arm at an opposite end thereof. The fixed electrode is herein a gapped signal line. On providing a voltage difference between the first and second electrode of the control structure, the movable electrode is connected to the fixed electrode, therewith closing the gap in the signal line.

It is a disadvantage that the known switch is able to switch between off and on only. In many applications, especially for telecommunications applications, it is preferred to switch between different signal lines.

It is therefore an object of the invention to provide an electronic device of the kind mentioned in the opening paragraph, which can be used for switched between different signal lines.

This object is achieved in an electronic device provided with a first and a second micro-electromechanical switch assembly on a substrate, between which first and second switch assembly a first line having a first impedance and a second line having a second impedance are present, the first switch assembly being provided with an input terminal and a first and a second output terminal connected to the first and the second line respectively, and the second switch assembly being provided with an output terminal and with a first and second input terminal connected to the first and second line respectively.

The switch assembly of the invention is thus neither a simple on-off switch, as a transistor is, nor a relay that can provide a connection between the first line and either the second line or the third line. With the switch of the invention, either the first line or the second line or both or none can be connected between the input and the output. This allows to connect certain parts of a circuit either in series or in parallel to each other, depending on the switches. Moreover, this is possible in a structure completely manufacturable in thin-film technology and wherein the resistance of a MEMS-switch in this connected state is very low.

A further advantage of the resulting structure is that no compromise is needed with respect to substrate resistance. As well known, switches are generally semiconductor devices, that are in most cases provided in a semiconductor substrate, with preferably a low-resistance. In order to combine them with lines having impedances, particularly those comprising inductors, capacitors, and/or resistors, discrete switches are assembled on a separate carrier, and the lines are provided on the carrier as well. This has the disadvantage of assembly costs. Another option is the provision of the lines onto the semiconductor substrate including the switches. However, for the operation of passive components a high-ohmic substrate is preferred, instead of the low-ohmic substrate in use for the switches. In the structure of the invention this compromise need not to be made, as both switches and lines are present on top of a substrate, that is preferably high-ohmic.

In a preferred embodiment the first line comprises an inductor turn. The assembly of the substrate is therefor very useful, since the inductor can be provided in the same metal layer as the terminals of the switch assemblies between which it is connected. In general, MEMS-switches have a movable electrode that is freestanding from the substrate and mechanically connected thereto through an electrically insulating cantilever arm. The movable electrode is preferably provided in a metal layer with sufficient thickness. Therewith the movable electrode is provided with the desired spring constant. The same thickness is particularly suitable for inductors in order to provide them with a high-Q factor.

In a further embodiment the second line is an interconnect, and a further inductor turn is connected to the output terminal of the second switch assembly, therewith providing a step-wise tunable inductor. With this embodiment, the inductor can be effectively tuned between a one-turn inductor and a two-turn inductor.

In another further embodiment, the second lines comprises an inductor turn of different length than the inductor turn of the first line, therewith providing a step-wise tunable inductor. With this embodiment both inductor turns can be used in parallel, or only one can be switched on. The length of the inductor turns can be chosen to obtain desired step sizes.

Such tuneable inductor structure is highly preferred, especially for impedance matching networks in mobile phones and the like. Such an impedance matching network comprises a series of low-loss high-Q inductors and capacitors. The use of step-wise tuneable inductor stuctures of the invention in an impedance matching network provides an improved matching or the complex impedance. Whereas with tuneable capacitors, such as MEMS-capacitors and varicaps the negative part of the complex impedance can be tuned, tuneable inductors are required for control of the positive part. If such tuneable inductors are absent, it leads to a less efficient signal transformation, when the mobile phone is switched to low power. With the switch to low power—e.g. a low real part of the impedance—the complex impedance changes as well, and not necessarily in a desired direction. This is not beneficial, neither in terms of battery-life or amplifier-efficiency, nor in power amplifier module lifetime due to the inherent internal temperature rise.

The adequate tuning of the impedance is particularly important for mobile phones that are meant to operate according to the UMTS-standard. A condition of this standard is that all users of the network must operate at the same strength signal strength. This implies that the impedance has to be tuned as a function of the distance between the mobile phone and the nearest base station.

In another embodiment the first and the second line each comprise a thin-film capacitor. In this manner, the capacity between the input and the output can be effectively tuned. The advantage is here again, that use can be made of the metal layers that are needed for the MEMS-switches to provide the capacitors. The respective input and output terminal can thus be in the same metal layer as the electrodes of the capacitors. Therewith, the additional resistance is very limited. However, there is of course no necessity that both capacitor electrodes are in the same metal layers as bottom and top electrode layers of the MEMS switches.

It is herewith observed that the switches in their opened state are in fact capacitors. However, the effective capacitance thereof is limited in comparison with the thin-film capacitors provided. As a result of the series positioning of the two switches and the capacitor, the effective capacitance of the line in the open, non-connected state is equal to that of half the capacitance of the switch in its open state. Thus, the capacitive functioning of the switches in the opened state is not problematic.

The switch assemblies of the invention are preferably embodied as assemblies with a single fixed electrode and—at least—two movable electrodes. I.e. the input terminal is connected to a fixed electrode; the output terminals are provided as a first and second movable electrode respectively, each of which movable electrodes is movable between a first position in which it is separated from the fixed electrode through an airgap, and a second position in which it is at least substantially in physical contact with the fixed electrode, and a first and a second control structure are present, with which the first and second movable electrodes are movable towards or away from the fixed electrode through application of a control voltage. This leads to a structure with minimal space, as the function to ensure mechanical stability is integrated.

The actuation hereof is realized electrostatically by preference, although other actuation mechanism known per se, such as piezoelectric actuation could be applied as well.

In a further embodiment, the first and second control structure have a first and a second electrodes, which second electrodes of the first and second control structure are mechanically connected with but electrically isolated from the first and second movable electrode respectively, such that a displacement of a second electrode moves the corresponding movable electrode towards or away from the fixed electrode, which second electrode is displaceable by application of a voltage difference between the first and second electrode of the control structure. In this manner, the control structure has electrodes which are positioned separately from the fixed and movable electrodes. Herewith, the individual driving of the first and second movable electrode can be realized robustly.

In a further embodiment at least partially electrically insulating cantilever arms connect the second electrodes of the control structures and the movable electrodes, which cantilever arms have the movable electrodes at a first end and have a common support structure at a second opposite end. This has the advantage that the dimensions of the switch are reduced. The first and second ends of the cantilever arm need not to be located at their extremities. It is further suitable that the second electrodes of the control structures are electrically connected to one ground plane, which is at least partially present in the support structure. This reduces the complexity of the control structure.

In an even further embodiment the fixed electrode and the movable electrodes are positioned substantially parallel to the substrate. This embodiment is preferred over an embodiment in which the fixed and movable electrodes are positioned substantially transverse to the substrate, in that such parallel arrangement can be integrated more easily with other components. This is for instance the case, if the electronic device comprises micro-electromechanical capacitors.

It is preferred that that the fixed electrode and the first electrodes of the control structures are present in one metal layer. It is further preferred that the input terminal is connected to a signal line through a vertical interconnect, the signal line being present in a second metal layer in which the movable electrodes are present as well. For components that are used in microwave and millimeter wave integrated circuits (MMICs) signal lines have to be of sufficient thickness in order to minimize the losses of the electrical transport through these lines. However, the thickness of the lines results in the problems with the stability of the capacitors. It is thus not possible to provide all lines with a large thickness. With this embodiment of the invention, the signal lines are all provided in one metal layer, that can be provided in a desired thickness, for instance 1-5 µm.

The invention therefor has as its second object to provide a method of matching the impedance of the device of the invention. This object is realized in that the impedance of the device according to claim 3 or 4 is step-wise tuned by means of selectively switching individual switches in the switch assemblies, so as to connect between the input and the output terminal either the first line or the second line or both.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which there are illustrated and described preferred embodiments of the present invention.

Figure 11:
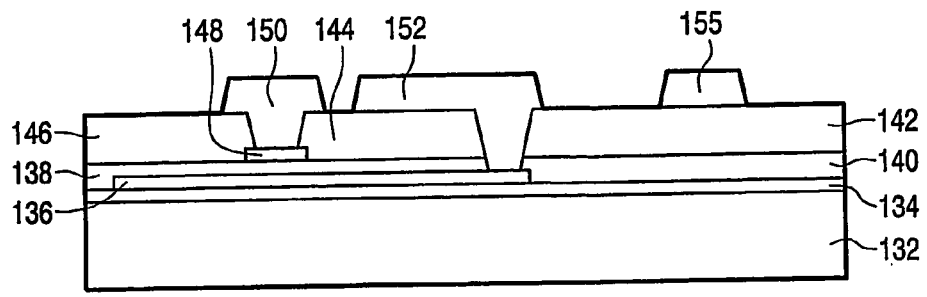
Figure 12:
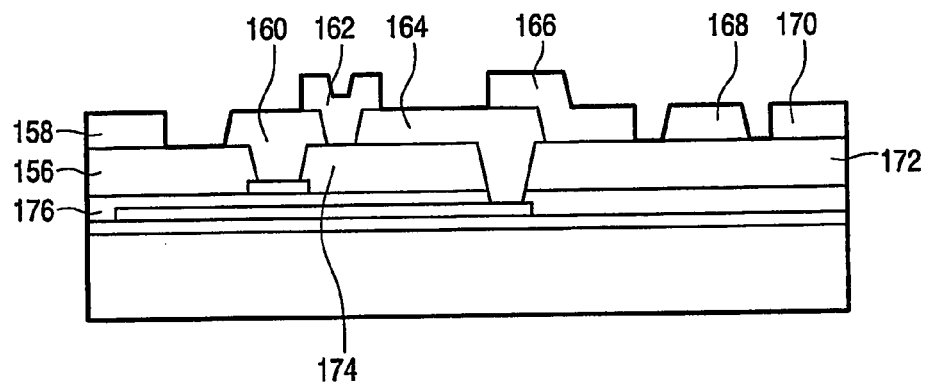
Figure 13:
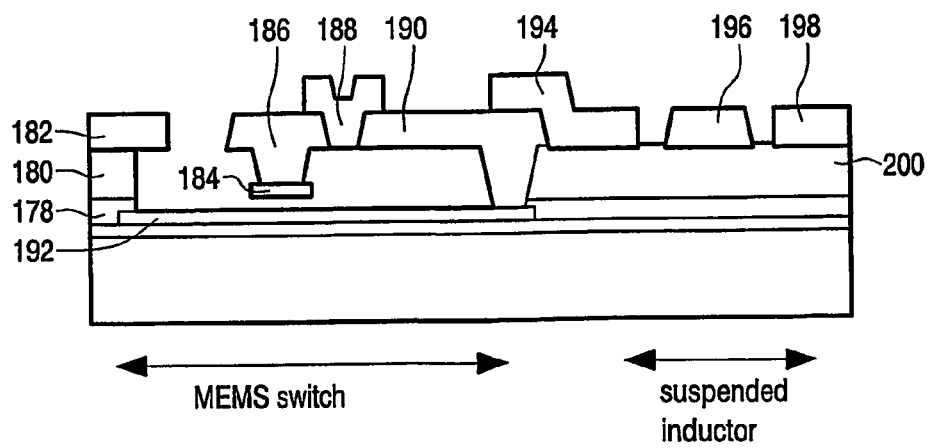
Figure 14:
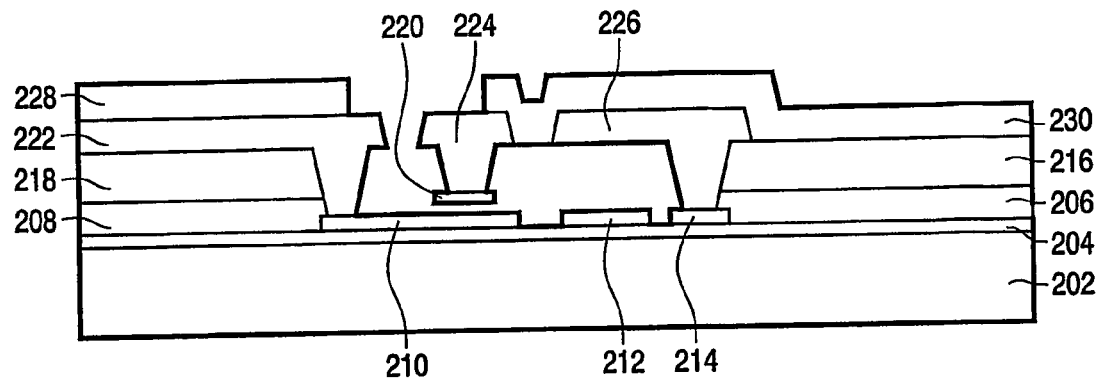
Figure 15:
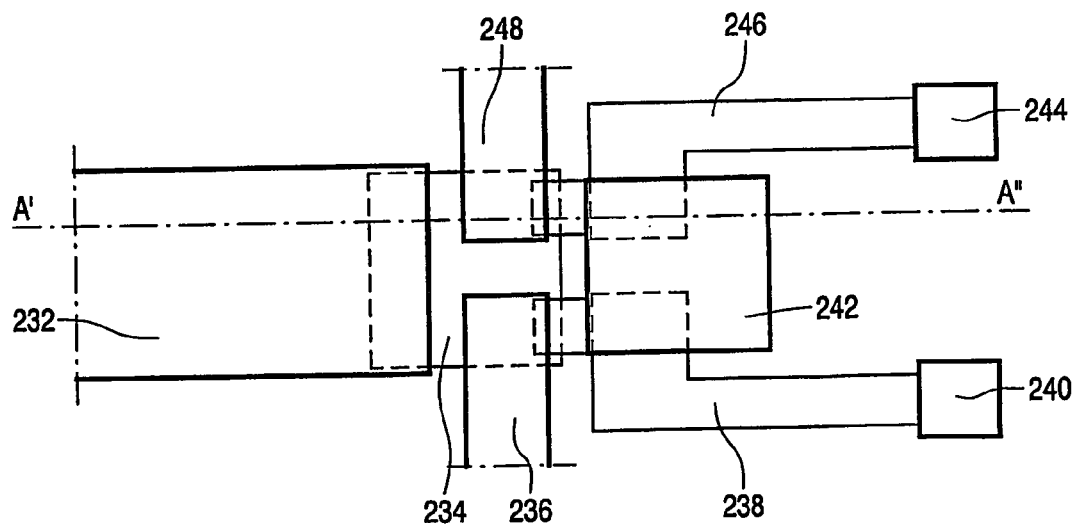
Figure 16:
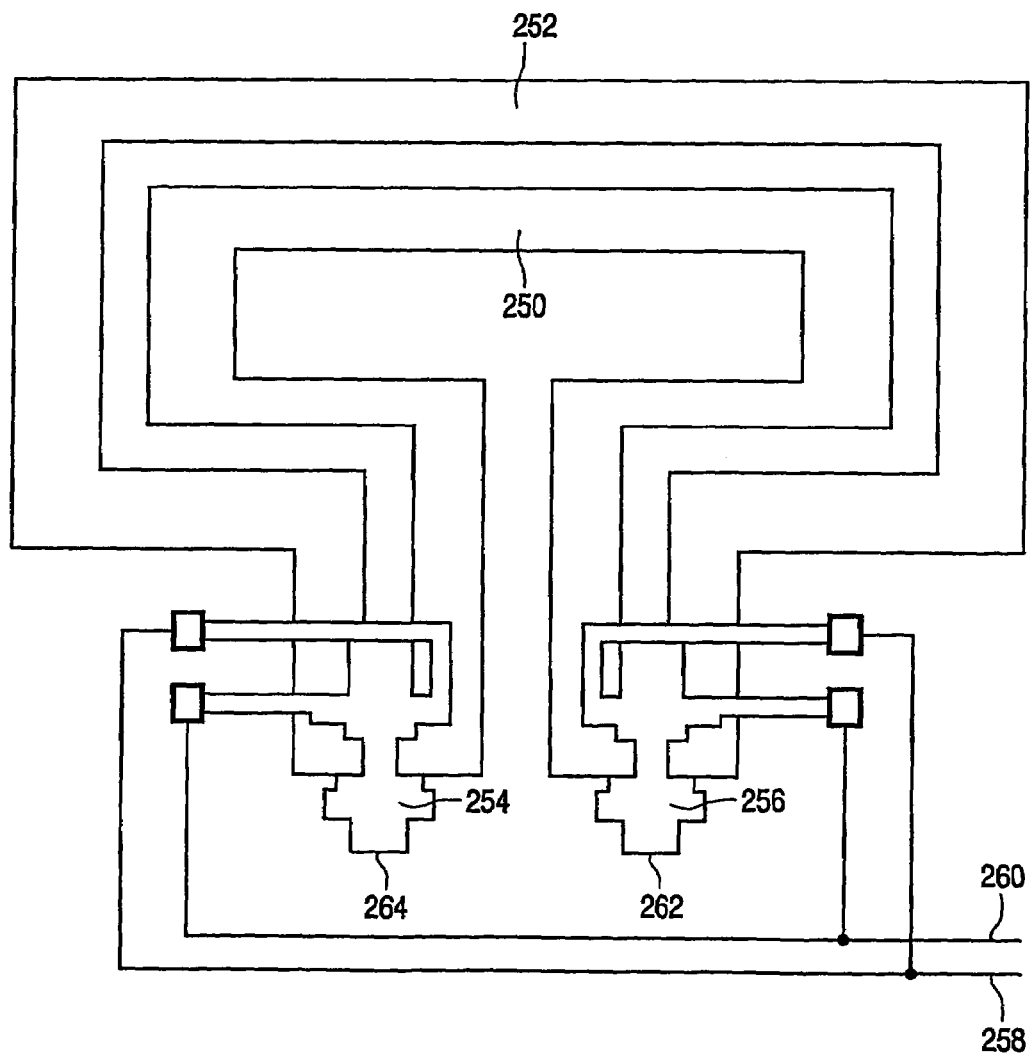
Figure 17:
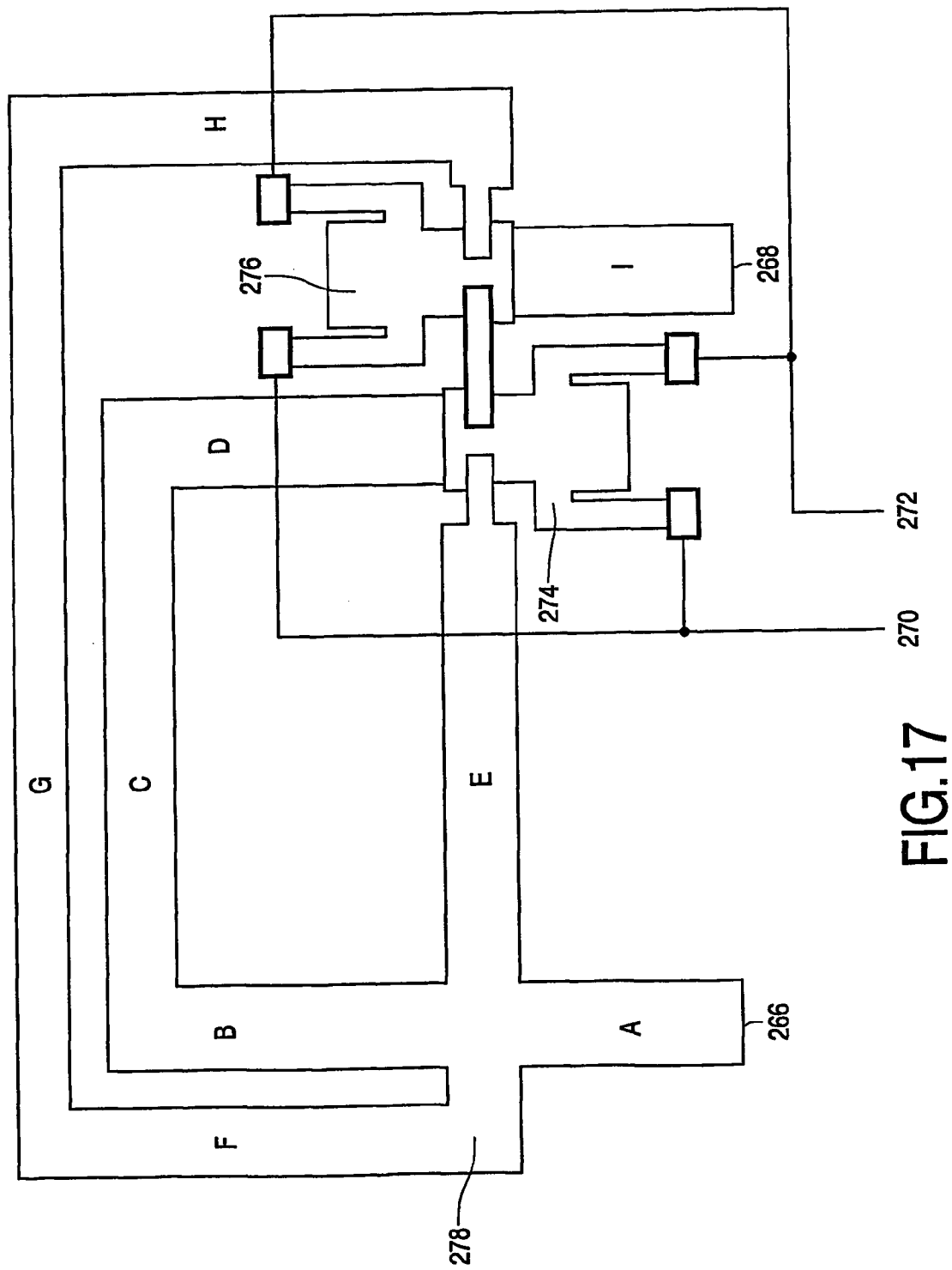
Figure 18:
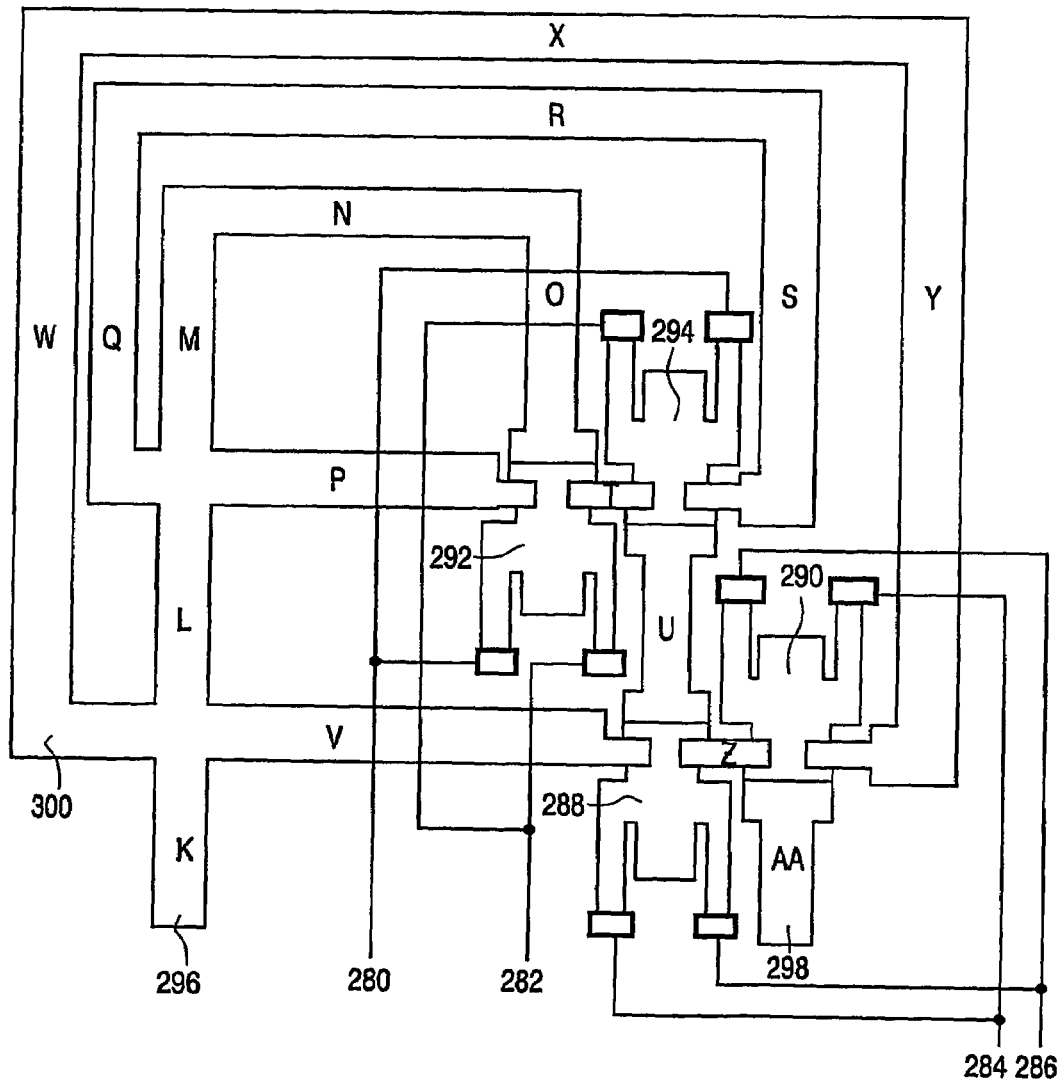
Figure 19:
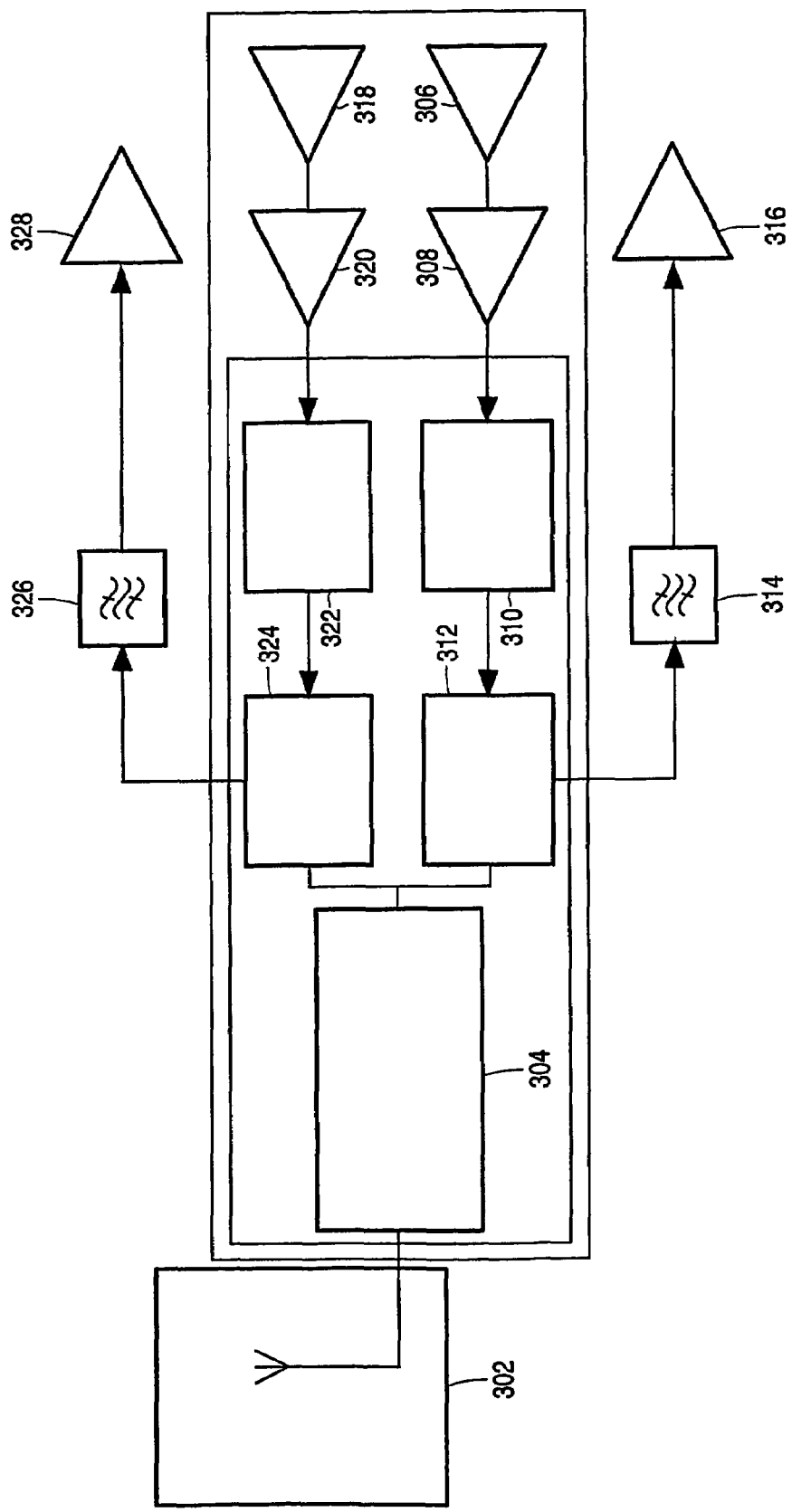
Figure 20:
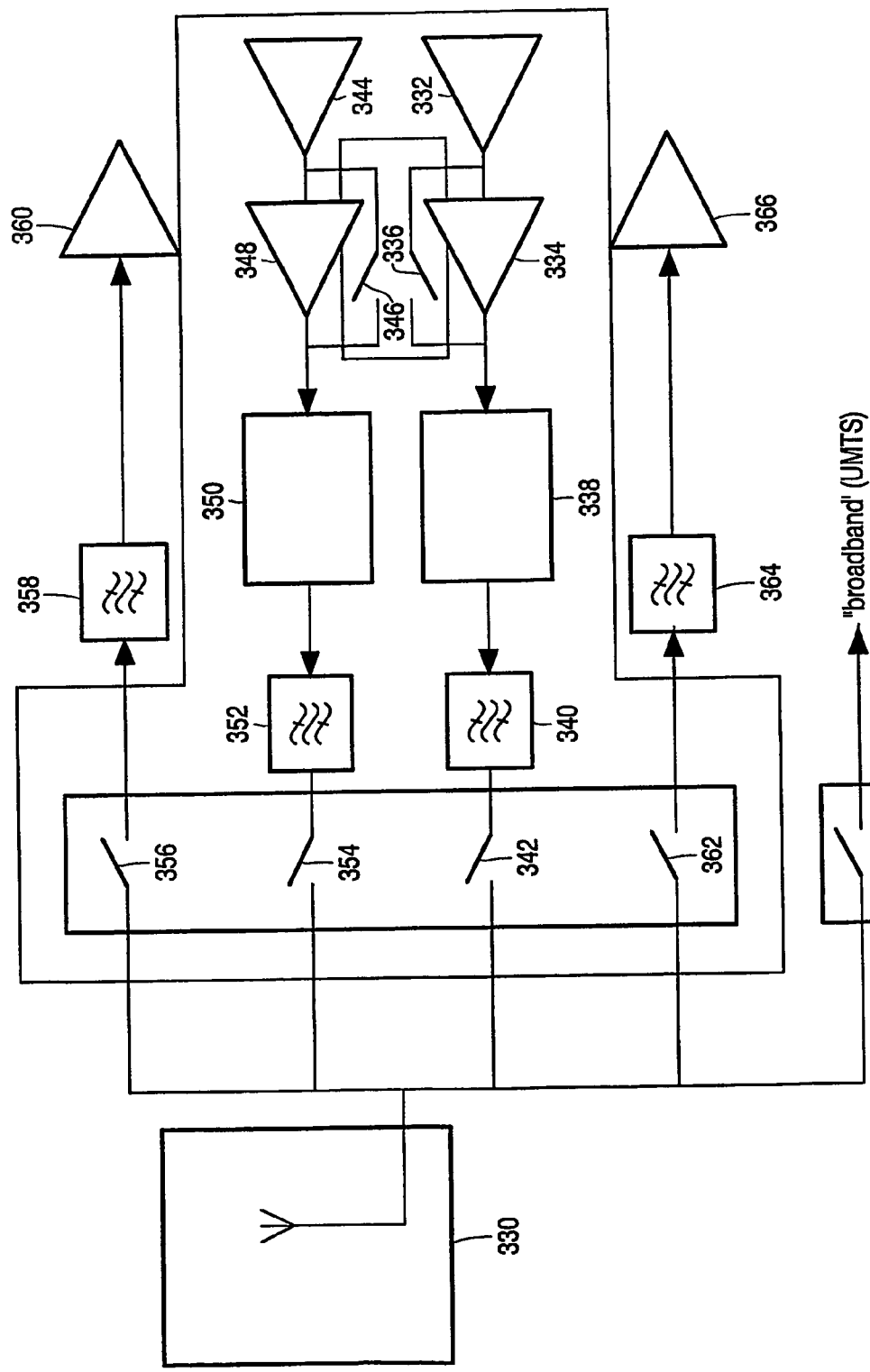
Figure 21:
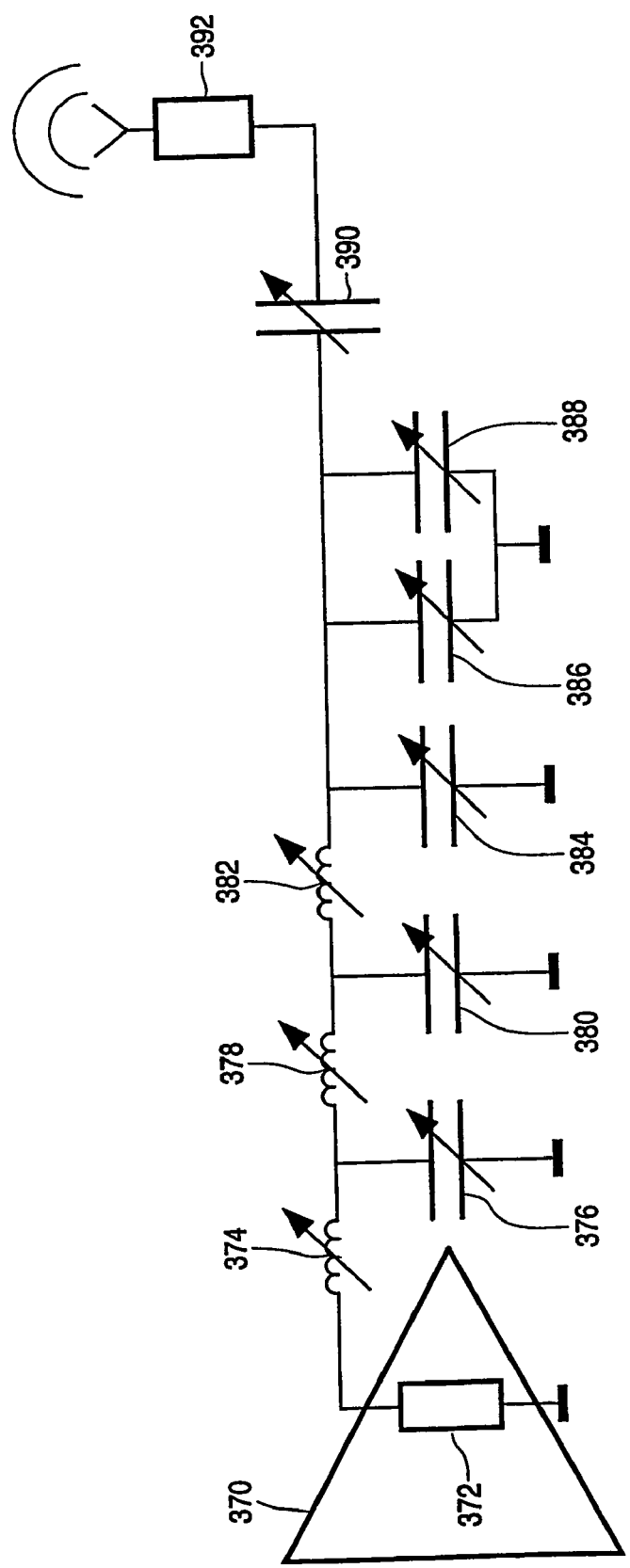

FIGS. 6, 7, 8, 9, and 10 show the principle steps of manufacturing a switch according to the present invention in thin film technology;

FIGS. 11, 12, and 13 show the principle steps of manufacturing of a switch and a suspended inductor of the present invention in thin film technology;

FIG. 14 shows a cross-sectional view following the line A'-A" in FIG. 15 of a switch according to the present invention;

FIG. 15 shows a top view related to the cross-sectional view of FIG. 14 of a switch according to the present invention;

FIGS. 16, 17, and 18 show different applications of the switch assemblies according to the present invention and conducting lines made in thin film technology creating the inductance;

FIG. 19 shows a block diagram of a conventional RF front-end used in a mobile phone;

FIG. 20 shows a block diagram of a RF front-end for multi-standard mobile phone using the present invention;

FIG. 21 shows an embodiment of an adaptive impedance matching network of the present invention matching both the output impedance of the amplifier IC (source) to the impedance of the antenna (load) and the impedance of the antenna to the output impedance of the amplifier IC.

Figure 1:
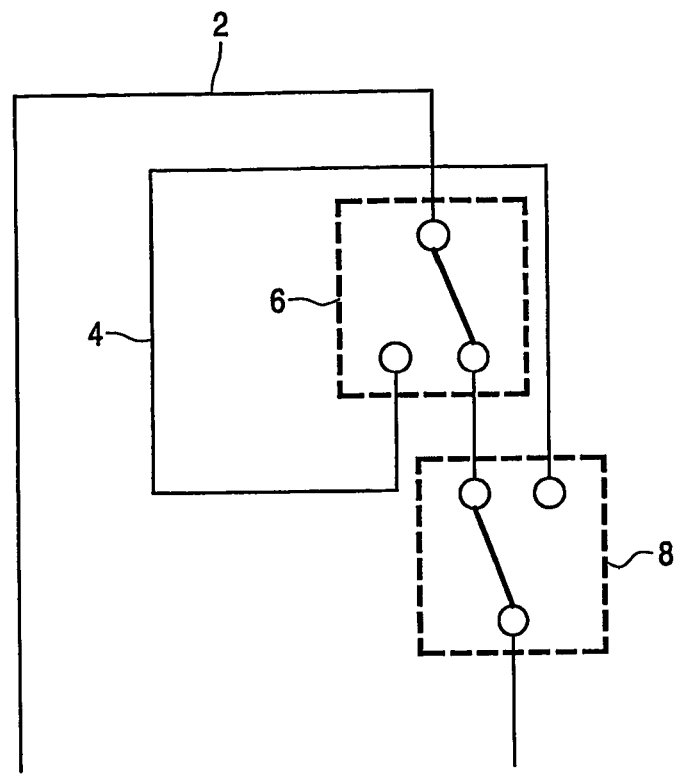
FIG. 1 shows a principle example of an adjustable inductance network between one or two turns in the off-state which means the switches are set for the single turn option.

FIG. 1 shows an example of the present invention. The principle of the present invention comprises a network of passive elements and MEMS devices. In the embodiment of FIG. 1 the passive elements are presented by the two inductor turns 2 and 4 and the MEMS devices are represented by the switch assemblies 6 and 8. The switch assemblies are in general used to change the value of the passive elements between fixed values. In this example the switch assemblies 6 and 8 are used to change the value of the given inductors 2 and 4 between two fixed values. In the shown OFF-state in FIG. 1 the inductor behaves as a single turn and has the lower inductance value.

Figure 2:
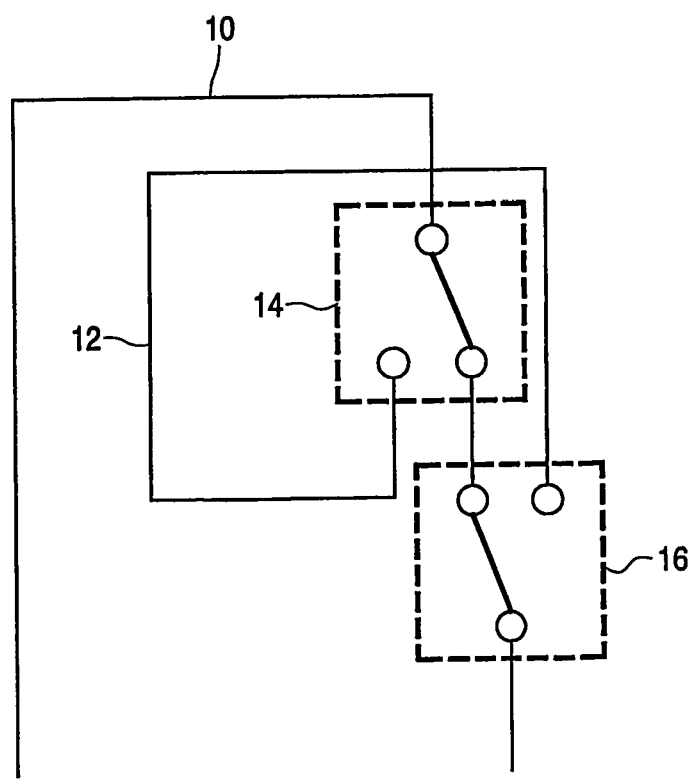
FIG. 2 shows the adjustable inductor of FIG. 1 in the on-state which means the switches are set for the two turn option.

In FIG. 2 is the ON-state of the in FIG. 1 described switches shown. In the ON-state an additional turn is incorporated into the inductor thereby raising the inductance value. This is done by the switch assemblies 14 and 16 by connecting the additional inductance turn 12 to the inductance turn 10. Thus, the positive part of the complex impedance of a matching network can be set to two fixed values. Often this will not be sufficient and thus a proper combination of a step-wise adjustable inductor and a MEMS-capacitor may be the required. The MEMS-capacitor is required in order to meet the desired negative value of the complex impedance. The approach may also be used to match the output of an impedance matching network to a variable load for example an antenna on a steel table or within a car, or the antenna near the human head of the user. In both cases the antenna impedance will not be a true 50 Ohms termination.

A major advantage of the proposed invention is the effect that switch assemblies may be operated at a relatively low-voltage at a virtually neglectable current.

Thus, low-power driving is provided while manufacturing can be done in existing IC-like processes. Furthermore, the example of FIG. 1 and FIG. 2 can be extended to multiple passive elements, such as inductors or capacitors or resistances, or multiple switch-assemblies in such a way that a range of complex impedance values may become available in the form of thin-film, light-weight, small-volume, and passive integration. Last but not least, as the switching frequency of switch assemblies ranges in the kHz region, adaptive impedance matching can be provided for UMTS applications, or for those applications where continuous adaptive impedance matching is required at several thousand times a second.

Figure 3:
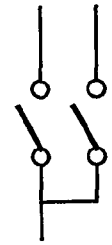
FIG. 3 shows a comparison of the possible states of a switch, a relay and a switch assembly according to the present invention.

FIG. 3 shows the possible states of a switch, a relay and an example of a switch-assembly of the present invention. The switch and the relay can only have the OFF-state or the ON-state which is shown in FIG. 3. The switch and the relay are not able to present the OR-state. On contrary to the switch and to the relay the switch assembly of the present invention is able to represent the OR-state besides the OFF-state and the ON-state. This is possible because of the advantage that each of the switches of the switch assembly can be set to either the ON- or OFF-state or when desired all contacts can be set to be open or closed at the same time. Obviously, this setup of the switch assembly of the present invention is not restricted to an assembly of two switches. The main feature of the switch assembly of the present invention is that one terminal, the called input terminal, of each switch is connected in parallel. This feature enables to change the value of a set of given passive elements connected between two switch assemblies between fixed values. Adaptive matching networks require the possibility to match the positive imaginary part and the negative imaginary part of the complex impedance of for instance the source to the load. The matching of a variable complex impedance is made by changing the positive imaginary part represented by inductance values and changing the negative imaginary part represented by capacitance values. The advantages of using MEMs switches above other switches are that they may be operated at a relative low-voltage at a virtually neglectable current, and MEMs switches may be incorporated in thin-film passive integration networks, thus enabling the use of a large number of such switches, and the switching frequency of MEMS-switches ranges in the kHz region, thus adaptive matching can be provided for UMTS applications and for applications requiring continuous matching every millisecond.

Figure 4:
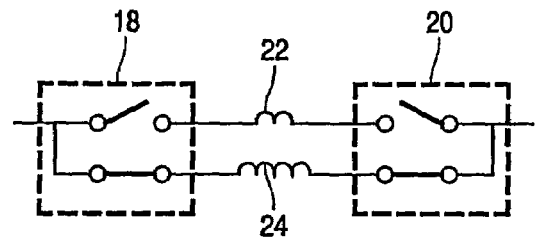
FIG. 4 shows an example of a configuration of the present invention in order to form an adjustable impedance matching network comprising two passive elements and two switch assemblies.

FIG. 4 shows an example of a selectable inductor. The selectable inductor comprises two switch assemblies 18 and 20 and two inductor turns 22 and 24 with different values. The inductors 22 and 24 are connected in parallel between the switch assemblies 18 and 20. Either a low or a high inductance value may be selected, or when both inductance values are selected at the same time, the effective inductance becomes equal to equation 1:

$$\frac{1}{L_{eff}} = \frac{1}{L_{low}} + \frac{1}{L_{high}} \quad (1)$$

The invention is not restricted to use only inductors. Alternatively, a capacitance or a ohmic resistance can also be used inspite of the inductance devices 22 and 24. Another possibility is that between the switch assemblies 18 and 20 can be different types of passive elements whereby passive elements of the same type may have different values.

Figure 5:
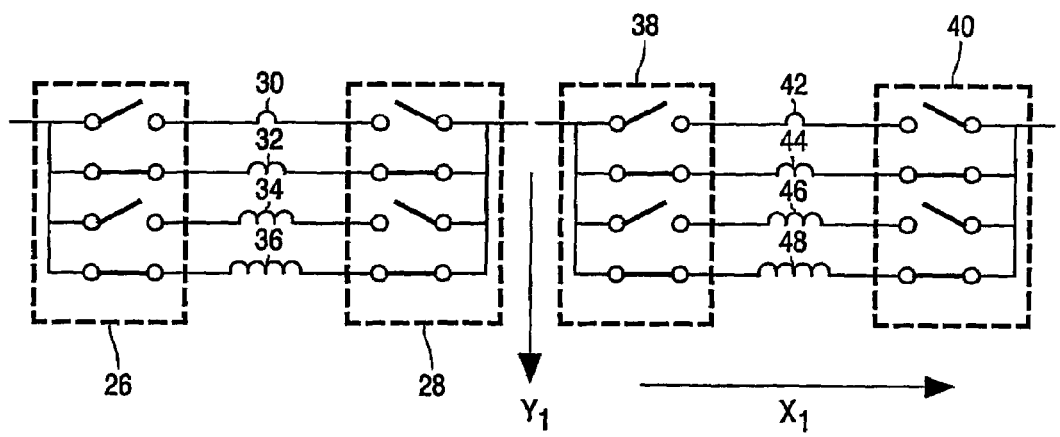
FIG. 5 shows an example of a configuration of the present invention in order to form an adjustable impedance matching network comprising a serial circuit of two parallel circuits each comprising passive elements of different values and two switch assemblies.

FIG. 5 shows a tuneable inductor. The tuneable inductor comprises a serial circuit of two parallel circuits comprising switch assemblies 26, 28, 38 and 40 and inductances with different values 30, 32, 34, 36, 42, 44, 46, and 48. The tuneable inductor is made expanding the number of switches of the switch assemblies and passive elements in either X or Y direction or both. The effective inductive value of this setup is given by equation 2:

$$L_{eff(X_i,Y_j)} = \sum_{x(i=1\ldots n)} \left[ \frac{1}{L_{eff\,y(j=1\ldots n)}} \right] \quad (2)$$

Also, this application is not restricted to inductors as said at FIG. 4. Between the switches of the switch assemblies 26, 28, 38, and 40 can be connected different types of passive elements such as an inductance, capacitance, and ohmic resistance. The different types of passive elements can be mixed in a setup between two switch assemblies. But not only the type of the passive elements can be mixed, also the values of equal types of passive elements can be different. Thus, the mentioned possibilities lead to a wide range of adjustable values of complex impedance. The matching can be done very comfortable because the types and the values of the matching passive elements can be selected very quickly by the switch assemblies.

Figure 6:
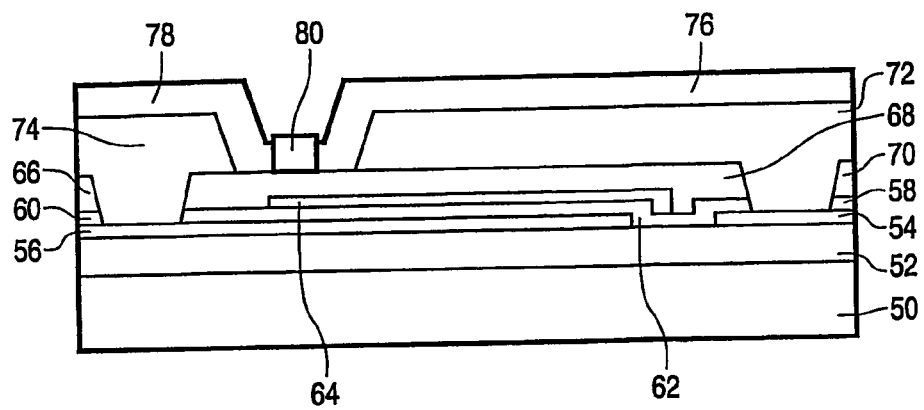

The FIGS. 6, 7, 8, 9, and 10 illustrate the process to form a tuneable capacitor in order to demonstrate the difference to the process of manufacturing a switch shown in FIGS. 11, 12, and 13. FIG. 6 shows the structure of the carrier at the beginning of the process forming a tuneable capacitor. In this case, the carrier comprises a high-ohmic silicon carrier 50. On top of the high-ohmic silcon carrier 50 is deposited a passivation layer 52. On top of the passivation layer 52 are deposited the first metal layers 54 and 56 and the dielectric layer 62. On top of the first metal layer 56 is deposited a dielectric layer 60, a third metal layer 74, the dielectric layer 62. On top of the first metal layer 54 is deposited the dielectric layer 62, a third metal layer 72 and a dielectric layer 58. On top of the dielectric layer 62 is deposited a second metal layer 64 and an oxide layer 68. On top of the dielectric layer 58 is deposited an oxide 70. On top of the dielectric layer 60 is deposited an oxide 66. On top of the oxide 66 is deposited the third metal layer 74. On top of the oxide 68 is deposited the third metal layer 74, a spin resist 76 and 78 and a third metal layer 72. On top of the oxide 70 is deposited the third metal layer 72. The access hole 80 is exposed in order to reach the oxide 68 through the spin resist of 76 and 78.

Figure 7:
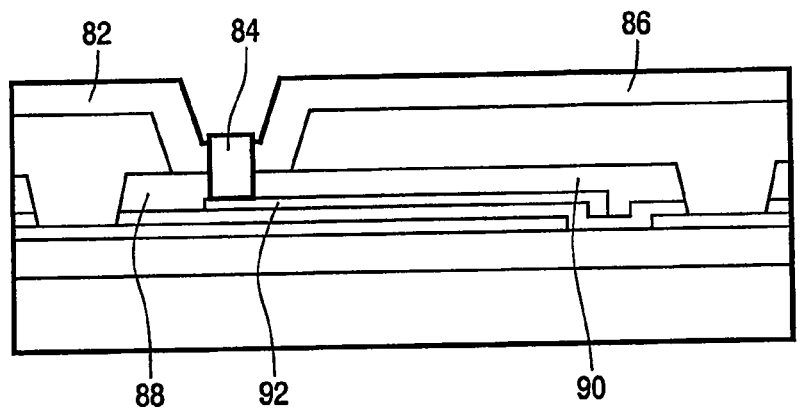

FIG. 7 shows that the access hole 84 which is located between the spin resist 82 and 86 is etched through the oxide layers 88 and 90 and an etch access hole is etched to the sacrificial second metal layer 92. The other layers of the wafer are the same as shown and described at FIG. 6.

Figure 8:
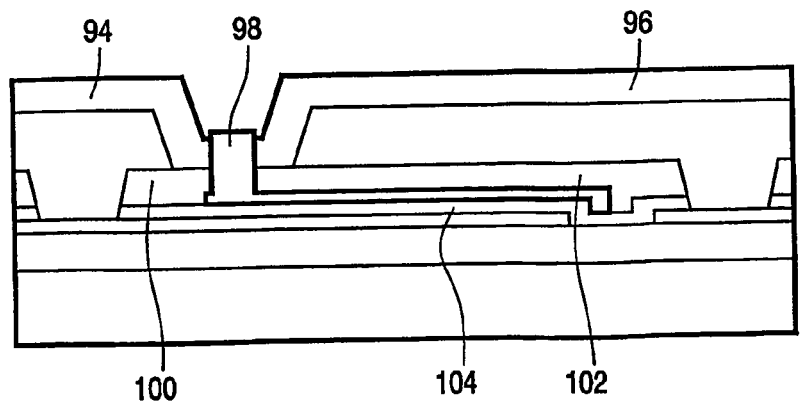

FIG. 8 shows the etching of the sacrificial metal layer between the oxide layers 100 and 102 and the dielectric layer 104. The access hole 98 reaches through the spin resist 94 and 96 and through the oxide layers 100 and 102 and includes now the former sacrificial metal layer 92 of FIG. 7. The other layers of the wafer are the same as described at FIG. 6.

Figure 9:
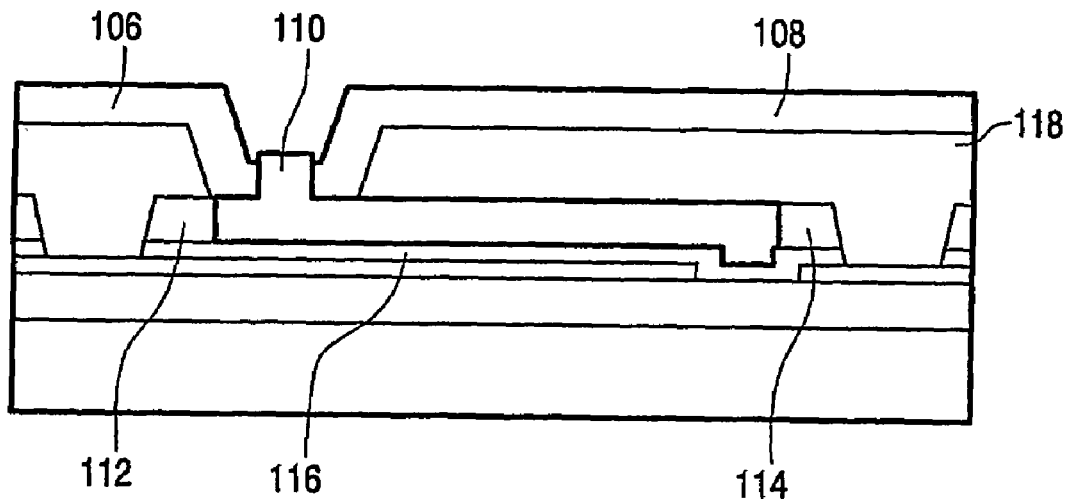

FIG. 9 shows the enlarged access hole 110 by etching the former oxide layers 100 and 102 of FIG. 8. The access hole 110 is now located between the spin resists 106 and 108, the decreased oxide layers 112 and 114, the dielectric layer 116 and the third metal layer 118. The other layers of the wafer are the same as described at FIG. 6.

Figure 10:
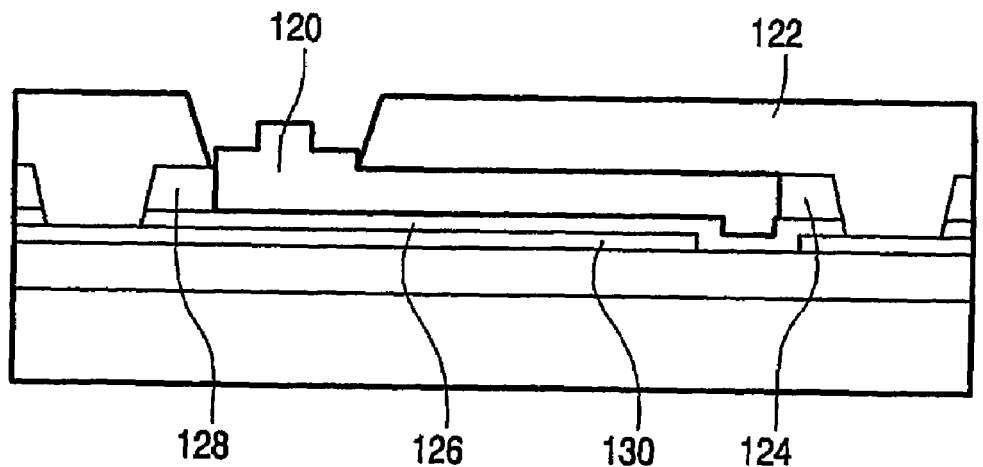

FIG. 10 shows the remove of the resist. Finally, the access hole 120 is now located between the third metal layer 122, the rest 124 of the former oxide layer 102, the dielectric layer 126 and another rest 128 of the former oxide layer 100. This process formed a tuneable capacitor comprising the movable bar 122 as one capacitor plate and the fixed first metal layer 130 as another capacitor plate having a dielectric layer 126 on top.

FIGS. 11, 12, and 13 show the process to form a switch and a suspended inductor on a carrier.

The carrier of FIG. 11 for example comprises a high-ohmic silicon carrier 132. On top of the high-ohmic silicon carrier is deposited a passivation layer 134. On top of the passivation layer 134 are deposited a first metal layer 136 and a dielectric layer 138 and 140. On top of the dielectric layer 138 are deposited a sacrificial layer 144 and 146 and a second metal layer 148. On top of the dielectric layer 140 is deposited a sacrificial layer 142. On top of the first metal layer 136 is deposited a third metal layer 152. On top of the second metal layer 148 is deposited a third metal layer 150. On top of the sacrificial layer 142 is deposited a third metal layer 155.

FIG. 12 describes the process when a polyimide is applied and patterned on the described wafer of FIG. 11. On top of the sacrificial layer 156 is deposited an insulator 158. The insulator 158 is spaced apart from the third metal layer 160. The insulator 162 is deposited between the third metal layer 160 and the third metal layer 164. The insulator 166 is also deposited on the third metal layer 164. Between the insulator 166 and the third metal layer 168 is a space left. The insulator 170 is mounted on the sacrificial layer 172. Between the third metal layer 168 and the insulator 170 is a space left. The other components of the wafer are the same as described at FIG. 11.

FIG. 13 describes the etching of the sacrificial layer 156 and 174 of FIG. 12 and the etching of the dielectric layer 176 of FIG. 12. The dielectric layer 178 in FIG. 13 is only a part of the original dielectric layer 176 which is shown in FIG. 12. Also the sacrificial layer 180 is only a part of the original sacrificial layer 156 and the sacrificial layer 174 shown in FIG. 12 is completely removed after the etch process. After the etching of the sacrificial layer in the dielectric layer is a space formed between the second metal layer 184 and the first metal layer 192. The switch is now formed out of the first metal layer 192 and the moveable part comprising the second metal layer 184, the third metal layer 186, the insulator 188, and the third metal layer 190. The switch is separated from the suspended inductor which is formed by the third metal layer 196 mounted on the sacrificial layer 200 by the insulator 194. The insulators 182 and 198 are mounted on the sacrificial layers 180 and 200.

The FIG. 14 shows a cross-sectional view along the line A'-A" in FIG. 15 of a switch. The switch shown in FIG. 14 comprises a carrier 202, a passivation layer 204 mounted on the carrier, a first metal layer 210, 212, and 214 deposited on top of the passivation layer 204, a dielectric layer 206 and 208 deposited on top of the passivation layer, a sacrificial layer 216, 218 deposited on top of the dielectric layer 206 and 208, a second metal layer 220 connected to the third metal layer 224, a third metal layer 222 deposited on top of the sacrificial layer 218 and the first metal layer 210, a third metal layer 226 deposited on top of the first metal layer 214 and an insulator layer 228 deposited on top of the third metal layer 222 and an insulator layer 230 deposited on top of the third metal layer 224, 226 and on the sacrificial layer 216. The electrostatic drive of each switch is between the first metal layer 212 and the third metal layer 214. In the "normal" configuration the switch is in the so-called normal open position, i.e. no contact is established. When a control voltage is applied, the electrostatic force between the first metal layer 212 and the third metal layer 226 pulls the third metal layer 224 and 226 down. Attached to the third metal layer 226, yet, isolated by the passivation layer 230 is a second section also made in the third metal layer 224. This could be an interconnect line to an inductor or a capacitor. The second third metal layer 224 is extended by the second metal layer 220 in order to be closer to the first metal layer 210.

For a large control voltage, contact is established between the first metal layer 210 and the second metal layer 220. Thus the structure acts as a switch. For a smaller control voltage, the gap between the first metal layer 210 and the second metal layer 220 becomes wider. Thus an alternative form of a MEMS capacitor is obtained using the same process of manufacturing a switch assembly.

The FIG. 15 shows a top view of the switch assembly. The switch assembly comprises two individual switches named A and B. The connecting element of both switches is the common input 232. The common input is made out of the third metal layer and the common input 232 corresponds to the third metal layer 222 in FIG. 14. The first metal layer 234 corresponds to the first metal layer 210 in FIG. 14 creating the bottom contact of both switches. The output 248 of switch A is made out of the third metal layer corresponding to the third metal layer 224 in FIG. 14. The third metal layer 242 connected to ground corresponds to the third metal layer 226 in FIG. 14. The DC drive of switch A is represented by the part number 244. The DC drive is connected to the switch via the first metal layer 246 which corresponds to the part with the number 212 in FIG. 14. The output of the switch B is represented by the part number 236 and is made of the third metal layer. The DC drive 240 of switch B made out of the third metal layer is connected via the first metal layer 238 to the switch. The ground of switch B is also represented by the part number 242.

The FIG. 16 shows a possible embodiment of the present invention comprising two different inductor turns 250 and 252 and two switch assemblies 254 and 256. The switch assemblies 254 and 256 correspond to the description of the switch assembly made in the FIGS. 14 and 15. The two switches A and B of each of the switch assemblies 254 and 256 are controlled by the signals of the terminals 258 and 260. The two signals of the terminal 258 and 260 control whether the inductance turn 250 or the inductance turn 252 is connected to the terminal 262 on the right side and to the terminal 264 on the left side. This network comprising the two inductor turns 250 and 252 and the two switch assemblies 254 and 256 is connected to another network by the two terminals 262 and 264. The terminals 258 and 260 are only control terminals. Another possible configuration would be whether both inductor turns 250 and 252 are used. This network provides the possibility to switch between altogether three different inductance values.

FIG. 17 illustrates another possible embodiment of the present invention. The inductor network comprises two switch assemblies 274 and 276 corresponding to the description of FIG. 14 and FIG. 15, a network of conducting lines forming the inductance in combination with the switch assemblies 274 and 276, the terminals 266 and 268 connecting the present inductor to another part of the impedance matching network, and the two control terminals 270 and 272 controlling the used inductance value. This network provides several possibilities to form several inductance values. The first possibility to form an inductance value is when only the switch of the switch assembly 276 is closed to connect the conducting line I to the conducting line J and when only the switch of the switch assembly 274 is closed which connects the conducting line J to the conducting line D. In this configuration an inductance is formed comprising the path of the conducting line parts A-B-C-D-J-I. In this situation a given small inductance value is connected to the terminals 266 and 268. A second possibility to form another value of inductance is when one switch of the switch assembly 274 connects the conducting line part D to the conducting line part E and the other switch of the switch assembly 274 is open and one switch of the switch assembly 276 connects the conducting line part H to the conducting line part I and the other switch of the switch assembly 276 is open. This possibility forms an inductance following the conducting line part A-B-C-D-E-F-G-H-I. In this possibility a larger inductance value is connected to the terminals 266 and 268.

FIG. 18 shows an embodiment of the present invention comprising four switch assemblies 288, 290, 292, and 294, four control terminals 280, 282, 284, 286, two terminals 296, 298 to connect this inductance forming network 300 to another part of the mathcing network. The principle of forming an inductance value is the same as described at the FIG. 17. In the case FIG. 18, however, the inductance forming network of FIG. 17 is extended by another turn. Thus either an inductor of one or two or three turns can be selected. Therefore, the different options to form different inductance values are not discussed in more detail. The shown principle of forming different inductance values in FIGS. 16, 17, and 18 can be extended by more than four switch assemblies and other passive elements such as capacitances or resistances. Furthermore, also the switch assemblies can be extended by more than two switches. This range of possibilities of forming an adjustable impedance matching network provides the advantage to match for example the complex impedance between an antenna and an power amplifier device for UMTS applications. In the RF domain every line acts as an inductor already. Thus, the inductors between the switch assemblies can also be embodied as delay lines, preferably with different lengths.

FIG. 19 shows a block diagram of a conventional RF front end of a mobile telephone. The block diagram comprises an antenna 302 for receiving and sending signals connected to a diplexer 304 switching between the digital communication system at about 1.800 MHz (DCS-1800) and the global system for mobile communications at about 900 MHz (GSM), a driver 306, connected to a power amplifier device 308 (PAD), driving the transmitting signals, a power amplifier device 308 (PAD) amplifing the GSM signals for transmission, which is connected to an impedance matching network 310 for impedance matching between the antenna 302 and the power amplifier device 308, which is connected to a Tx/Rx switch 312 switching between the GSM signal which is transmitted (GSM Tx) and the GSM signal which is received (GSM Rx), which is connected to the diplexer 304 and to a filter 314 for filtering the received GSM signal (GSM Rx), which is connected to a low noise amplifier (LNA) 316 for amplification of the received GSM signal (GSM Rx), a driver 318 for driving the digital communication system signal which is to be transmitted (DCS Tx), which is connected to a power amplifier device (PAD) 320 for amplification of the digital communication systems signal which is to be transmitted (DCS Tx), which is connected to an impedance matching network 322 matching the impedance between the antenna 302 and the power amplifier devices 320, which is connected to a Tx/Rx switch 324 switching between the digital communication system signal which is to be transmitted (DCS Tx) and the digital communication system signal which is to be received (DCS Rx), which is connected to the diplexer 304 and to a filter 326 filtering the received digital communication system signal (DCS Rx), which is connected to a low noise amplifier 328 (LNA) for amplification of the received digital communication system signal (DCS Rx). The impedance matching network 310, 322 in conventional RF front ends of mobile telephones is at the moment a fixed impedance matching network. Because of the desire of adjustable impedance matching the application of the present invention for an adjustable impedance matching network is a possible embodiment of the present invention.

In the case of a mobile phone, the RF-signal transformation is provided between an active power amplifier device (PAD), which is the source, and an antenna, which is the load. In the ideal case, the generated RF power is only dissipated by the load. However, because the impedance of a given inductor-capacitor network is also frequency dependent, i.e. it only performs optimal at one given frequency, and actual inductors and capacitors are not perfect loss-less elements, i.e. contain some parasitic resistance, a fraction of the generated RF power is also dissipated in the impedance network. Obviously, this fraction should be as small as possible, and is of particular importance in mobile phones.

In general, and in particular in mobile phones, the input impedance of an active source is of much lower complex impedance (~1±1j Ohms) than that of the often real impedance of the load (~12.5-50 Ohms). This is because sufficient RF-power (~1-4 Watts) must be generated by a power amplifier device operating at a low supply voltage (~3 Volts), e.g. by a small battery-pack. Thus the current is high, i.e. several Amperes. Any parasitic resistive component therefore inherently contributes to an increased RF loss. Part of this loss can be reduced in using high-Q, i.e. low resistivity, inductors and capacitors. Another part of the RF-loss can be reduced in providing a good match between the complex output impedance of the active power amplifying device and the complex input impedance of the passive matching network, and of course the output impedance of the matching network towards the load.

Unfortunately, the value of the complex output impedance of an active power amplifier device also depends on its DC supply voltage and operating frequency. For mobile phone applications, spanning a range of transmit frequencies, this can be a problem. In addition, problems may arise due to a too low battery supply voltage, or because, for example, the mobile phone is so near to a repeater (receive/transmit server) that its RF output-power may or must be switched to low power in order to extend battery-life. Thus, in most case the complex impedance of the power amplifier device is changed to such an extent that a less effective signal transformation occurs. This is because the impedance matching network is static. Obviously a reduced efficiency is not beneficial, neither in terms of battery-life or amplifier-efficiency, nor in power amplifier module life-time due to the inherent internal temperature rise (the real part of the complex impedance dissipates power). Nevertheless, all can be tolerated to some extent and, hence, adaptive matching, i.e. active power control is more a feature/wish than a must in, for instance, the global system for mobile communications (GSM) operating at about 900 MHz or the digital communication system (DCS-1800) operating at about 1800 MHz.

In Wide-Code Division Multiple Access (W-CDMA), which is used for the Universal Mobile Telecommunication System (UMTS) in the next generation of mobile phones, active power control is a must. It is required in order to enable digital data transfer in a wireless network because all talkers on that network must operate at the same signal strength, i.e. S/N-ratio at the repeater, the receiving end. Thus, active power control at the talker is a must and, hence, adjustable impedance matching is an essential part of this technology.

Tuneable capacitors, for instance such as a MEMS-capacitor or a varicap, may offer a part of the solution in both low-power/high-power switching applications and/or "active" RF output-power control, e.g. impedance control. However, as only the value of the capacitance of a MEMS-capacitor can be changed for instance by a control voltage, control of the complex impedance can only take place for the negative part of the complex impedance. For control of the positive part of the complex impedance inductors are required.

A small sized version of an adjustable impedance matching network is desired which contains a tuneable inductor besides a tuneable capacitor. Large sized versions exist in which for instance a mechanical contact is positioned along the circumference of a cylindrically wound inductor. An example thereof, is for instance known from U.S. Pat. No. 5,070,317.

Yet, besides from its size and weight, also the "static" nature of such a tuneable inductor is not an acceptable option for continuous power control in mobile applications. This because adaption in UMTS has to take place at about 4.000 times a second.

FIG. 20 shows the practical embodiment of the adaptive impedance matching network in a RF front end for multi-standard mobile phone. The block diagram of FIG. 20 comprises in principle a GSM line for transmitting a signal comprising a driver 332, connected to a power amplifier device (PAD) 334, a switch 336 connected in parallel to the power amplifier device 334 for saving power in case of the power of the driver is enough to reach the next transponder (transmitter/receiver station) with the power of the driver 332, an adaptive impedance matching network 338 connected to the power amplifier device (PAD) 334 and to a filter 340 filtering the transmitted signals connected to a switch 342 connecting the GSM Tx-line to the antenna 330, a digital communication systems line for transmitting a signal comprising a driver 334 connected to a power amplifier device (PAD) 348, a switch connected in parallel to the power amplifier device 348 in order to save power when the output power of the driver is enough to reach the next transponder, an adaptive impedance matching network 350 matching the impedances of the antenna and the power amplifier device (PAD) 348 connected to the power amplifier device 348 and to a filter 352 filtering the transmitted signals connected to a switch switching the digital communication systems line for transmitting a signal to the antenna 330. Furthermore, the block diagram comprises a digital communication systems line for receiving a signal comprising a switch 356 connecting the antenna 330 to the filter 358 filtering the received signal DCS Rx connected to a low noise amplifier (LNA) 360 amplifing the received signal. Next to the receiving line of the digital communication system signals there is a receiving line for GSM signals comprising a switch 362 connecting the antenna 330 to the filter 364 connected to a low noise amplifier (LNA) 366 amplifing the received signal. Additionally, there is also a switch 368 for receiving broad band signals like UMTS signals. The advantage of this embodiment is that the variable output impedance of the power amplifier device 348, 334 can be matched to the antenna 330. The factors which influence the output impedance of a power amplifier device are the operating frequency, the output power level, the battery supply voltage, and a mismatch of the antenna impedance. The adaptive impedance matching network can therefore match the actual impedance of the power amplifier device to the actual impedance of the antenna The advantage is a better efficiency of transmitting power from the power amplifier device to the antenna. With respect to the antenna, it is notable that the impedance of a given antenna, for example designed at 50 Ohms, may also change. This is for instance the case when a mobile phone is placed on a metal table, or when the phone is hold near to the ear. In either situations the coupling of the antenna towards its environment changes (when compared to free-air). The change in environment can make the antenna to behave either inductive or capacitive. Therefore, also changes at the output impedance of a given matching network, for example due to antenna mismatch, call for an adaptive impedance matching network. An adaptive impedance matching network therefore contains preferably both tuneable inductors and capacitors. Exactly this is provided by the present invention. The advantage of using MEMS devices for adjustable impedance matching networks is shown in the following table 1.

TABLE 1

Qualitative comparison of switch technology concerning applications in mobile phones.

| Parameter | p-i-n diode | p-high electron mobility transistor (HEMT) | MEMS device |
|---|---|---|---|
| insertion loss (dB) | 0.5-0.6 | 0.6-0.7 | 0.1 |
| isolation (dB) | 20-30 | 20-30 | 65 |
| power consumption | transceive: 10's mW receive: µW's | µW's | µW's only during closing |
| control voltage (V) | 2 | 3-5 | 5-50 |
| linearity | Good | comparable with p-i-n diode | better than p-i-n diode |

Table 1 is a qualitative comparison of switch technologies. The table is intended to show the advantage of using MEMS devices for adjustable impedance matching networks compared to the use of other switch technologies. The following switch technologies are compared: a p-i-n diode, a p-high electron mobility transistor and a MEMS device. The insertion loss of a technology is a value for the attenuation of a input wave. The lower the insertion loss is, the higher is the level of the wave at the output of the device of a certain technology. The isolation is a value of the attenuation of the signal at the output compared to the signal at the input when the switch is open. The higher the isolation is, the better is the technology of the switch. The power consumption is a value for the energy which is used for opening or closing the switch of a certain technology. The lower the power consumption is, the better is the technology for application in mobile phones. The control voltage is a value of the signal which is used to control the switch of a certain technology. The linearity is a value of the phase of a switch of a certain technology. The better the linearity is, the better is the switch technology because the phase of a signal which runs through a switch is more or less changed depending of the linearity of the technology of the switch. The better the linearity of a switch technology is the smaller is the change of the phase of the signal. The desire is that the phase of the signal is not changed by the switch. Passive elements have a better linearity than active elements. Comparing the three different switch technologies, it becomes clear that the technology of the MEMS devices has the lowest insertion loss from the three compared technologies. The value of 0.1 means that a wave of e.g. 1 dB at the input of the device is attenuated by 0.1 dB that results in an output signal level of 0.9 dB. Also the isolation of the MEMS device is about the factor 1.000 higher than the isolation of the other two switch technologies. This means that the isolation of MEMS devices is much better than the isolation of p-i-n diodes and p-high-electron mobility transistors. The power consumption of micro-electro-mechanical system devices is about µW only during closing. Compared to the p-high electron mobility transistor the micro-electro-mechanical systems device is quite equal in the power consumption. The power consumption of the p-i-n diode switch technology is quite higher than the micro-electro-mechanical systems device in the case of transceiving. The p-i-n diode power consumption is quite equal to the micro-electro-mechanical systems device in the case of receiving. It can be said, that also the power consumption of the MEMS devices is better than the other two technologies. The control voltage of the micro-electro-mechanical systems device is the highest control voltage between the three compared switch technologies. The linearity of the micro-electro-mechanical systems device is better than the linearity of the p-i-n diode and the p-high electron mobility transistor because the micro-electromechnical systems device is a passive device and the other two technologies are active.

FIG. 21 shows another application of the present invention for adaptive impedance matching. All drawn inductors and capacitors are tuneable. The FIG. 21 comprises a power amplifier 370 having a complex impedance 372 connected to an adjustable impedance matching network comprising the inductance 374 connected to the inductance 378 and the capacitance 376 connected to ground, the inductance 378 is connected with the other terminal to the inductance 382 and the capacitance 380 connected to ground, the inductance 382 is connected with the other terminal to the capacitance 384 connected to ground and to the parallel circuit comprising the capacitance 386 and the capacitance 388 both connected to ground and the inductance 382 is connected with the other terminal also to the capacitance 390, the capacitance 390 is connected with the other terminal to the impedance 392 of the antenna. The impedance matching network matches the complex impedance 372 of the power amplifier 370 to the complex impedance 392 of the antenna. The impedance transformation is made in three stages comprising the first stage of the inductance 374 and the capacitance 376, the second stage comprising the inductance 378 and the capacitance 380, and the third stage comprising the inductance 382 and the capacitance 384. The capacitor 390 has the functions of uncoupling the DC from the source to the load and to match the imaginary part on the AC side of the load represented here by the complex impedance 392 to the source represented here by the complex impedance 372. As before mentioned, the complex impedance 372 of the power amplifier 370 is influenced by the operating frequency, the output power level, the battery supply voltage, and the mismatch of the antenna impedance. Another problem is that the complex impedance 392 of the antenna is influenced by several factors of the environment, for instance when a mobile phone is placed on a metal table, or when the mobile phone is hold near to the ear. The change in environment can make the antenna to behave either inductive or capacitive. Therefore, also changes at the output impedance of a given matching network call for an adaptive impedance matching network. An adaptive impedance matching network therefore contains preferably both tuneable inductors and tuneable capacitors. These tuneable inductors and tuneable capacitors of the drawn impedance matching network adjust the impedance transformation from the complex impedance 372 of the power amplifier 370 to the complex impedance 392 of the antenna or vice versa.

In short, the invention relates to an electronic device comprising a pair of micro-electromechanical (MEMS) switch-assemblies, said switch-assemblies (6, 8, 14, 16) being connected to passive elements (2, 4, 10, 12) to form parallel circuits and/or serial circuits of said passive elements (2, 4, 10, 12) and said switch-assemblies (6, 8, 14, 16), said circuits having a range of impedance values. Therefore, the electronic device is preferably an adjustable impedance matching network. Within the term micro-electromechanical (MEMS) switch-assemblies any current and future version of MEMS switches and the like are meant to be included.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. An electronic device provided with a first and a second micro-electromechanical switch assembly on a substrate, between which first and second switch assembly a first line having a first impedance and a second line having a second impedance are present, the first switch assembly being provided with an input terminal and a first and a second output terminal connected to the first and the second line respectively, and the second switch assembly being provided with an output terminal and with a first and second input terminal connected to the first and second line respectively, wherein the first and second switch assemblies are each arranged to, in one switching condition thereof, connect the input terminal of the first switch assembly to only one of the first and second output terminals of the first switch assembly, and to connect only one of the first and second input terminals of the second switch assembly to the output terminal of the second switch assembly; and wherein the first and second switch assemblies are each arranged to, in another switching condition thereof, connect the input terminal of the first switch assembly to both of the first and second output terminals of the first switch assembly, and to connect both of the first and second input terminals of the second switch assembly to the output terminal of the second switch assembly.

2. An electronic device as claimed in claim 1, characterized in that the first line comprise an inductor turn.

3. An electronic device as claimed in claim 2, characterized in that the second line is an interconnect, and that a further inductor turn is connected to the output terminal of the second switch assembly, therewith providing a step-wise tunable inductor.

4. An electronic device as claimed in claim 2, characterized in that the second line comprises an inductor turn of different length than the inductor turn of the first line, therewith providing a step-wise tunable inductor.

5. An electronic device as claimed in claim 1, characterized in that the first and second line each comprise a thin-film capacitor.

6. An electronic device as claimed in claim 1, characterized in that in the first switch assembly the input terminal is connected to a fixed electrode; the output terminals are provided as a first and second movable electrode respectively, each of which movable electrodes is movable between a first position in which it is separated from the fixed electrode through an airgap, and a second position in which it is at least substantially in physical contact with the fixed electrode, and a first and a second control structure are present, with which the first and second movable electrodes are movable towards or away from the fixed electrode through application of a control voltage.

7. An electronic device as claimed in claim 6, characterized in that the first and second control structure have a first and a second electrodes, which second electrodes of the first and second control structure are mechanically connected with but electrically isolated from the first and second movable electrode respectively, such that a displacement of a second electrode moves the corresponding movable electrode towards or away from the fixed electrode, which second electrode is displaceable by application of a voltage difference between the first and second electrode of the control structure.

8. An electronic device as claimed in claim 7, characterized in that at least partially electrically insulating cantilever arms connect the second electrodes of the control structures and the movable electrodes, which cantilever arms have the movable electrodes at a first end and have a common support structure at a second opposite end.

9. An electronic device as claimed in claim 8, characterized in that the second electrodes of the control structures are electrically connected to one ground plane, which is at least partially present in the support structure.

10. An electronic device as claimed in claim 1, characterized in that the input terminal is connected to a signal line through a vertical interconnect, the signal line being present in a second metal layer in which the movable electrodes are present as well.

11. An electronic device as claimed in claim 3, characterized in that the step-wise tuneable inductor structure is part of an impedance matching network, further comprising a micro-electromechanical capacitor.

* * * * *